United States Patent
Kalnitsky et al.

(10) Patent No.: US 6,420,217 B1
(45) Date of Patent: Jul. 16, 2002

(54) METHOD OF AN APPARATUS FOR PROGRAMMING AN INTEGRATED FUSE ELEMENT TO HIGH RESISTANCE IN LOW VOLTAGE TECHNOLOGY

(75) Inventors: Alexander Kalnitsky, San Francisco; Pavel Poplevine, Foster City; Albert Bergemont, Palo Alto, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/632,375

(22) Filed: Aug. 3, 2000

Related U.S. Application Data

(62) Division of application No. 09/376,161, filed on Aug. 17, 1999.

(51) Int. Cl.[7] ............................................. H01L 21/82
(52) U.S. Cl. ...................................................... 438/132
(58) Field of Search ................................ 438/10, 11, 13, 438/17, 18, 132, 466, 467; 257/529

(56) References Cited

U.S. PATENT DOCUMENTS 5,708,291 A * 1/1998 Bohr et al. ................. 257/529

* cited by examiner

Primary Examiner—Keith Christianson
(74) Attorney, Agent, or Firm—Skjerven Morrill LLP

(57) ABSTRACT

An integrated fuse element is capable of being programmed to high resistance in low voltage process technology. The fuse includes a stack of an undoped polysilicon layer and a silicide layer. A voltage applied across the stack is increases until a first agglomeration event occurs, whereby a discontinuity is formed in the silicide layer. The current is further increased to cause a second agglomeration event whereby the size of the discontinuity is increased. Each agglomeration event increases the resistance of the fuse. An extended-drain MOS transistor, capable of sustaining high voltage, is connected in series with the fuse for programming the fuse. The transistor includes: a well region in a substrate, the well region forming the drain of the transistor; an insulating trench in the well; and a polysilicon gate extending over a portion of the substrate, a portion of the well and a portion of the trench, wherein upon reverse-biasing the junction between the well and the substrate a depletion region is formed which encompasses at least the entire portion of the surface region of the well over which the polysilicon extends.

10 Claims, 6 Drawing Sheets

METHOD OF AN APPARATUS FOR PROGRAMMING AN INTEGRATED FUSE ELEMENT TO HIGH RESISTANCE IN LOW VOLTAGE TECHNOLOGY

This application is a division of Ser. No. 09/376,161 filed Aug. 17, 1999.

BACKGROUND

1. Field of the Invention

The invention relates to fuse elements used in semiconductor devices, and more particularly to an integrated fuse element capable of being programmed to high resistance in low voltage process technology.

2. Description of Related Art

Fuses are frequently used in integrated circuits to permanently store information, or to form the desired interconnections after the integrated circuit is manufactured.

A fuse 80 is shown in FIG. 1. Fuse 80 and the corresponding programming and sensing circuitries are described in detail in the patent issued to Bohr et al. (U.S. Pat. No. 5,708,291, issued Jan. 13, 1998). The fuse device of Bohr et al. has a low programming voltage, and thus, a low programming current. This requires that the sensing circuit used to sense whether the fuse has been programmed or burned, does not burn (i.e. program) an unburned (i.e. unprogrammed) fuse in the sensing process. Further, the fuse device may exhibit only a small change in resistance between an unprogrammed state and a programmed state. Thus, Bohr et al.'s fuse requires a sensing circuit sensitive enough to detect relatively small changes in resistance to reliably determine whether the fuse has been programmed. To that end, Bohr et al. uses relatively complex reference resistance and current mirror scheme which consumes large silicon area.

Thus, a fuse structure and a method for programming the fuse is needed which enables programming the fuse to high resistance in low voltage process technologies, and allows simple circuitry which consumes minimal silicon area to be used for sensing the state of the fuse.

SUMMARY

In accordance with this invention, an integrated fuse element capable of being programmed to high resistance in a low voltage process technology is provided. The fuse includes a stack of a low resistivity material over and in contact with a high resistivity material. As part of the invention, to program the fuse, a voltage applied across the stack is increased until a first agglomeration event occurs, whereby a discontinuity is formed in the low resistivity material. The voltage is further increased to cause a second agglomeration event whereby the size of the discontinuity is increased. Each agglomeration event increases the resistance of the fuse.

In one embodiment, the low resistivity material is silicide and the high resistivity material is undoped polysilicon.

In one embodiment, an extended-drain MOS transistor capable of sustaining high voltage is coupled to the fuse for programming the fuse. The transistor includes: a well region of a first conductivity type in a bulk region of a conductivity type opposite the well region, the well region forming the drain of the transistor; an insulating trench in the well; a polysilicon gate extending over a portion of the substrate and a portion of the trench; a first diffusion region in the well region, the first diffusion region being laterally spaced from the polysilicon layer by the trench; and a second diffusion region in the bulk region, the second diffusion region forming a source of the transistor, the first and second diffusion regions having a conductivity type opposite the bulk region.

In one embodiment, the portion of the bulk region over which the polysilicon layer extends forms a channel region; and the polysilicon layer extends over a portion of the well region, the portion of the well region including a surface region adjacent to the channel region.

In another embodiment, upon reverse-biasing the junction between the well and the bulk region a depletion region is formed which encompasses the surface region of the well adjacent to the channel region.

In another embodiment, the trench is formed to have a depth and a surface width so that a parasitic resistance between the first diffusion region and the channel region is minimized.

In another embodiment, the MOS transistor and the fuse element are serially-connected between a power supply terminal and a ground terminal, the drain of the MOS transistor being connected to the fuse element, the MOS transistor being for programming the fuse to have a higher resistance as compared to an unprogrammed fuse.

In another embodiment, the MOS transistor is coupled to both the fuse element and a sensing circuit which senses the state of the fuse. The transistor isolates a high voltage applied to the fuse from the sensing circuit. In one embodiment, the drain of the MOS transistor is connected to one end of the fuse element, and the source of the MOS transistor is connected to the sensing circuit.

In another embodiment, the transistor is a NMOS or a PMOS transistor.

Other features and advantages of the invention are described below. The invention is defined by the appended claims.

BRIEF DESCRIPTION OF THE DRAWINGS

The present invention may be better understood, and its numerous objects, features, and advantages made apparent to those skilled in the art by referencing the accompanying drawings.

FIG. 5b shows an exploded cross section view of the encircled region M in FIG. 5a.

FIG. 6 shows a cross section view of two parallelconnected programming devices, each device being similar to that shown in FIG. 5a.

The use of the same reference symbols in the drawings indicates similar or identical items.

DESCRIPTION OF PREFERRED EMBODIMENTS

Figure 2A:
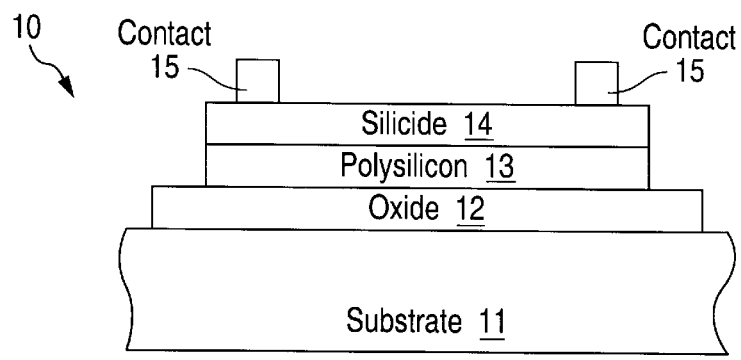
FIG. 2a shows a cross section view of a fuse element in accordance with the present invention.

FIG. 2a shows a cross section of a fuse element 10 in accordance with the invention. Fuse 10 is a multi-layered structure which includes an insulating layer 12 over a substrate region 11, a polysilicon layer 13 over insulating layer 12, and a silicide layer 14 over and in contact with polysilicon layer 13. Contacts 15 are provided over silicide 14 to enable passing current through the silicide 14 and polysilicon 13 layers for programming fuse 10. Polysilicon 13 is undoped to maintain high resistance.

In its unprogrammed state (FIG. 2a), the resistance of fuse 10 is substantially equal to that of silicide 14, because the resistance of silicide is substantially less than that of polysilicon (by about a factor of $1 \times 10^5$ to $1 \times 10^7$ for undoped polysilicon).

Figure 2B:
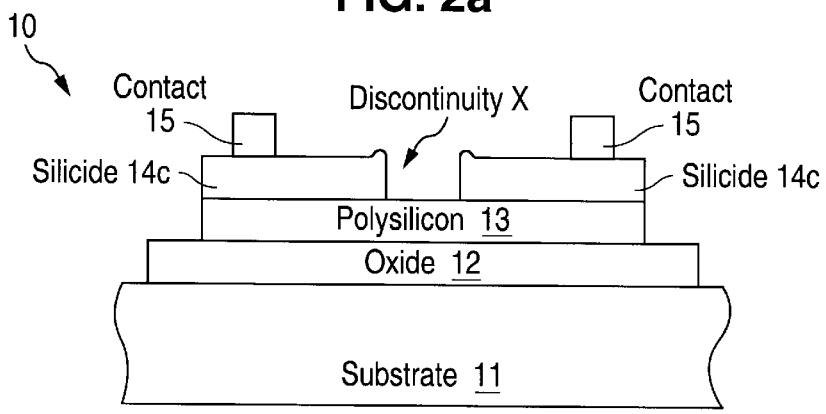
FIGS. 2b and 2c show the formation of respective discontinuities X and Y in the fuse element of FIG. 2a by two consecutive agglomeration events.
Figure 3:
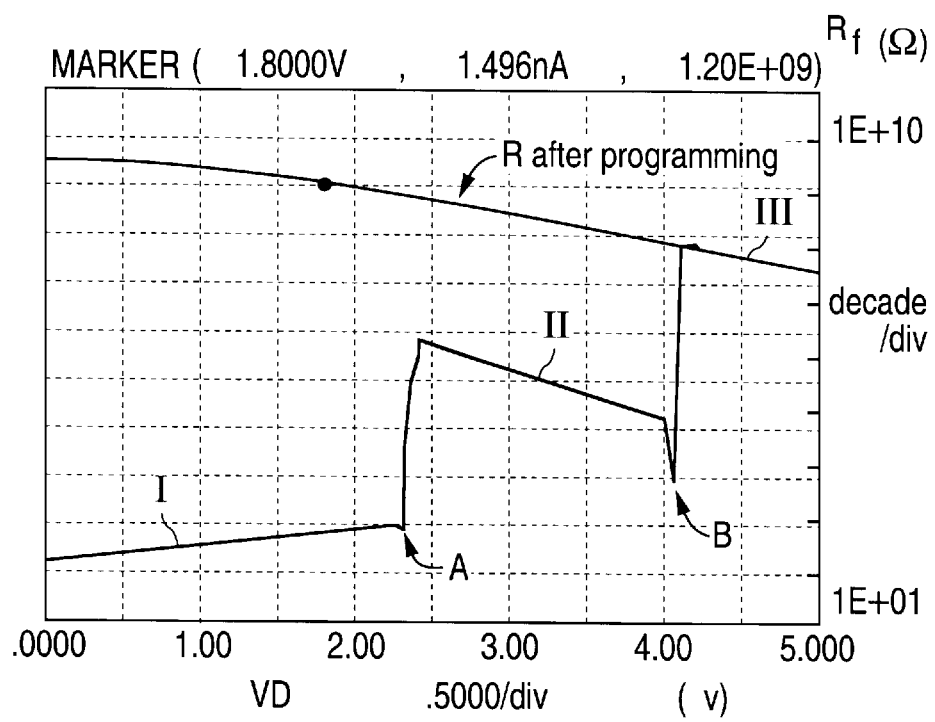
FIG. 3 shows the programming characteristics of fuse 10.

FIG. 3 shows the programming characteristics of fuse 10. The log of the fuse resistance $R_f$ (right vertical axis) is plotted against voltage $V_D$ (horizontal axis) applied across fuse 10. As $V_D$ is increased from 0V, current $I_D$ starts to flow from one contact 15 (FIG. 2a) to the other through silicide layer 14. An increasing current causes silicide 14 to heat up, and thus become more resistive, as indicated by the rising slope of the portion of the FIG. 3 curve marked with roman numeral I. When the voltage reaches approximately 2.3V (point A), the current through fuse 10 is sufficiently high to cause agglomeration of silicide 14. A discontinuity X is thus formed in the silicide layer, as shown in FIG. 2b. Where the discontinuity in silicide 14 is formed, the current flows through the exposed polysilicon portion. This results in a sudden increase in the fuse resistance, as indicated at point A in FIG. 3.

Figure 2C:
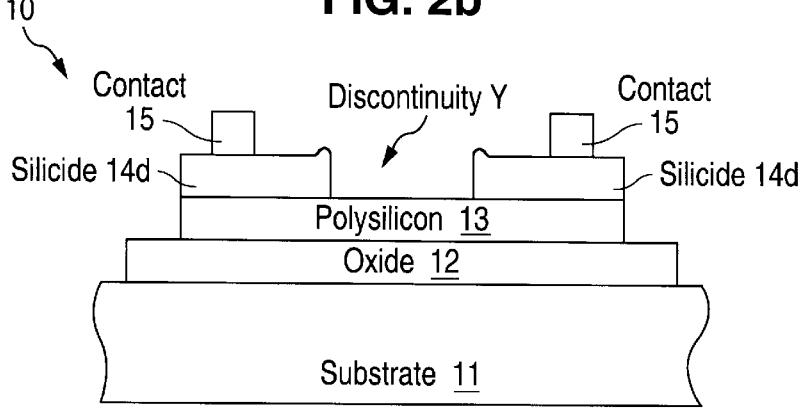

Further increasing the voltage across fuse 10 causes depletion of polysilicon layer 13 and the corresponding reduction in resistance, as indicated by portion of the FIG. 3 curve marked with the roman numeral II. Note that no depletion region would form if polysilicon 13 was heavily doped. Once the exposed polysilicon region is completely depleted, the resistance of fuse 10 is determined by the remaining silicide portions 14C of FIG. 2b. As soon as a current level sufficient to heat the remaining silicide portions 14C is achieved (i.e., at $V_D$ equal to 4.1V), a secondary silicide agglomeration occurs. Thus, discontinuity X of FIG. 2b is widened to that shown in FIG. 2c. This results in a another sudden increase in the fuse resistance, as indicated at point B in FIG. 3. The resistance of fuse 10 after the second agglomeration is characterized by the down-sloping line at top of the FIG. 3 diagram.

In this manner, each silicide agglomeration event enlarges the exposed polysilicon portion which increases the fuse resistance. Thus, high resistance values can be achieved by programming the fuse with voltages in excess of 3.5V. These voltages, however, are too high to be switched by a regular transistor in a sub-0.25 μm CMOS technology. Voltages greater than 3.5V across the gate oxide of a regular transistor in such technology can damage the gate oxide. A special device suitable for such low voltage technologies is thus needed. One such programming device is shown in FIGS. 4 and 5a.

Figure 4:
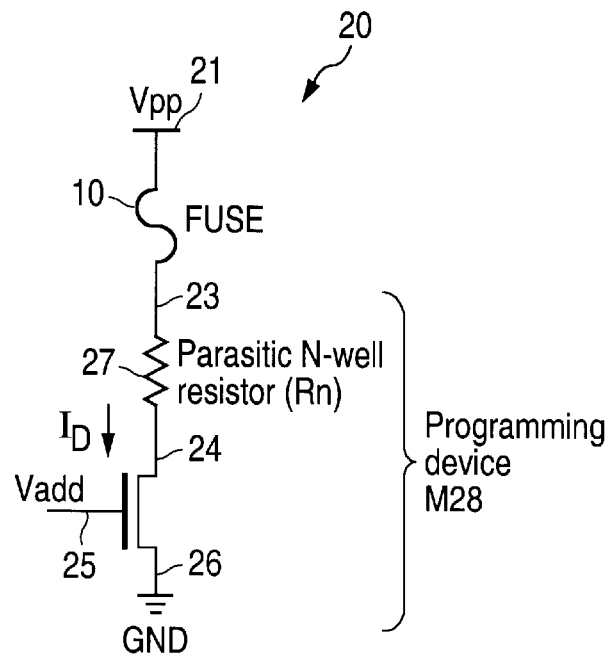
FIG. 4 shows a circuit for programming fuse 10.
Figure 5A:
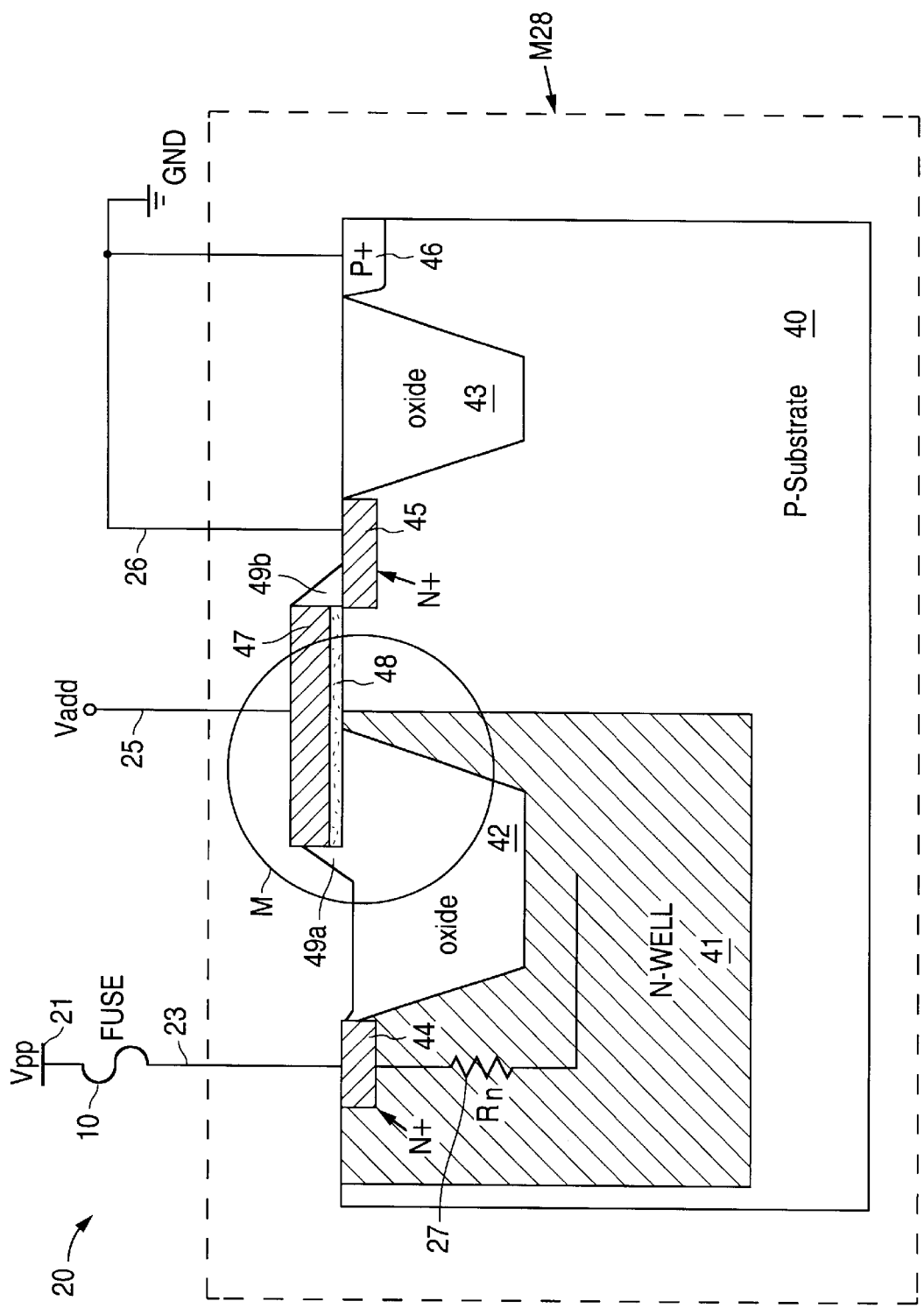
FIG. 5a shows a cross section view of the programming device M28 of FIG. 4 as connected in circuit 20 of FIG. 4.

FIG. 4 shows a circuit 20 having a programming device M28 and a fuse 10 serially-connected between a power supply terminal Vpp and a ground terminal GND. Fuse 10 has one end connected to Vpp and the other end connected to lead 23. Device M28 is an "extended drain" NMOS transistor having a drain connected to lead 23, a gate connected to lead 25, and a source connected to GND. A signal Vadd is applied to the gate of device M28 for controlling the current ID through device M28. Device M28 has a parasitic resistor Rn at its drain due to an N-well drain structure described in more detail below.

Fuse 10 in its unprogrammed state is a short circuit. With a power supply voltage (e.g., 5V) applied at Vpp terminal, a current $I_D$ starts to flow from Vpp to GND when Vadd is increased over the threshold voltage (Vt) of device M28. Current ID increases as Vadd is increased over Vt of device M28 until device M28 reaches saturation.

Device M28 programs Fuse 10 to the desired resistance by forcing the appropriate amount of current through fuse 10. To provide the high currents required for multiple agglomerations, high Vpp voltage (e.g., greater than 3.5V) is used. With fuse 10 in an unprogrammed state, Vpp of for example 4V, and Vadd of 0V, the full Vpp of 4V appears across drain to gate of device M28. Device M28 needs to be capable of sustaining such high voltage.

FIG. 5a shows a cross section of the programming device M28 formed in a P-type substrate 40. A N-well 41 which includes a N+ diffusion region 44 is formed in substrate 40. A trench isolation region 42 which separates N+ region 44 from an edge of N-well 41 is formed in N-well 41. A gate insulating layer 48 extends over a portion of the surface of substrate 40, a portion of N-well 41, and a portion of trench 42, as shown. A polysilicon layer 47 extends over the gate insulating layer 48. Spacers 49a, 49b are formed adjacent to polysilicon 47 side-walls. A N+ diffusion region 45 and a P+ diffusion region 46 separated by another trench isolation region 43 are formed in substrate 40. N+ region 45 forms the source of device M28, N-well 41 and N+ region 44 together form the drain of device M28, and polysilicon layer 47 forms the gate of device M28. The portion of the substrate surface over which polysilicon layer 47 extends forms the transistor channel region. P+ region 46 is provided for biasing substrate 40 to the ground potential. Fuse 10, Vpp, Vadd, and GND connections to device M28 shown in FIG. 5a mirror those in FIG. 4, and are provided for clarity.

In one embodiment, in a 0.25 μm CMOS technology, substrate 40 has a doping of approximately $2 \times 10^{15}$ cm$^{-2}$, N-well 41 has a depth in the range of 0.8 μm to 1.5 μm and a peak doping of $1 \times 10^{17}$ cm$^{-2}$, N+ regions 44 and 45 have a depth of less than 0.2 μm and a doping in the range of $1 \times 10^{19}$ cm$^{-2}$ to $3 \times 10^{20}$ cm$^{-2}$. The preferred depth and surface width of trench 42 are the minimum tolerated by the process in order to minimize a well parasitic resistance Rn which is described below. Each of the width and depth of trench 42 may be in the range of 0.2 μm to 0.4 μm. Polysilicon 47 overlap of trench 42 may be 0.2 μm or less depending on the stepper capabilities. The distance between the left edge of polysilicon 47 and the right edge of N+ region 44 may be about 0.15 μm or less depending on the lithography limitations. At the substrate surface, the distance between the right edge of trench 42 and the right edge of N-well 41 is preferred to be 0 μm, however, a distance of 0.2 μm may be required to allow for possible misalignment of the trench opening to the N-well mask. The distance between the right edge of N-well 41 and the right edge of polysilicon 47, which defines the channel region of device M28, should be minimized to achieve the smallest channel length. This distance may be in the range of 0.3 μm to 0.6 μm depending upon misalignment limitations.

The trenches 52 and 60 are formed using conventional methods (e.g., the silicon is etched back to form the trench in the silicon, the side-walls of the trench are oxidized, the trench is filled with oxide, and surface region is polished back). The trench oxide may be a high density plasma (HDP) oxide. Spacers 49a/49b and trench 43 are provided for completion, and may be eliminated if desired.

Figure 5B:
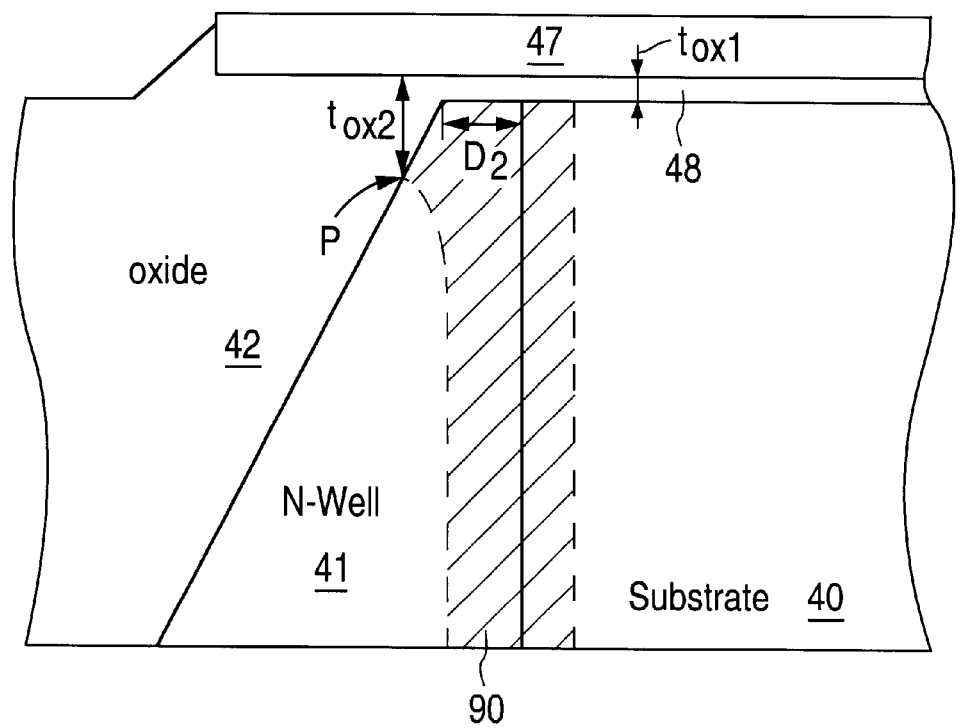

The "extended drain" configuration (i.e., laterally separating the drain diffusion 44 from gate 47) of device M28 along with use of shallow trench isolation enables application of high voltages to device M28. In the unprogrammed state, fuse 10 provides Vpp to N+ region 44 of device M28. With substrate 40 at ground potential, Vpp reverse biases the junction between N-well 41 and substrate 40, thus forming a depletion region around this junction. This is more clearly illustrated in FIG. 5b which shows an exploded view of the encircled region M of FIG. 5a. The depletion region is shown as the cross-hatched area 90. The portion of the N-well surface marked as D2 is completely depleted, and the left edge of depletion region 90 is pushed out to point P. With gate 47 at 0V, device M28 draws no current, and thus the full Vpp is transferred through the N-well region 41 to the edge of the depletion region. Thus, the voltage at point P is equal to Vpp. The point at which the Vpp voltage is closest in distance to gate 47 is point P. The oxide thickness at point P is marked as $t_{ox2}$. As shown, $t_{ox2}$ is greater than the thickness of gate oxide 48 (marked as $t_{ox1}$). In this manner, the full Vpp voltage does not appear across gate oxide 48, and thus gate oxide 48 is protected against high voltage.

Accordingly, for a given Vpp voltage and the resulting depletion region width, D2 must be small enough (preferably 0μm) to ensure that the oxide thickness across which full Vpp appears is greater than $t_{ox1}$. For example, lower Vpp voltages result in narrower depletion region 90, requiring a narrower D2 to ensure that $t_{ox2}$ is greater than $t_{ox1}$.

The separation between the channel region and the drain N+ region 44 results in the parasitic resistor Rn in N-well 41. Resistor Rn is in the current path of device M28, and thus causes device M28 to have a lower drive capability. To compensate for the loss of drive, the width of device M28 can be increased. This is accomplished by placing two extended drain devices M28 in parallel.

Figure 6:
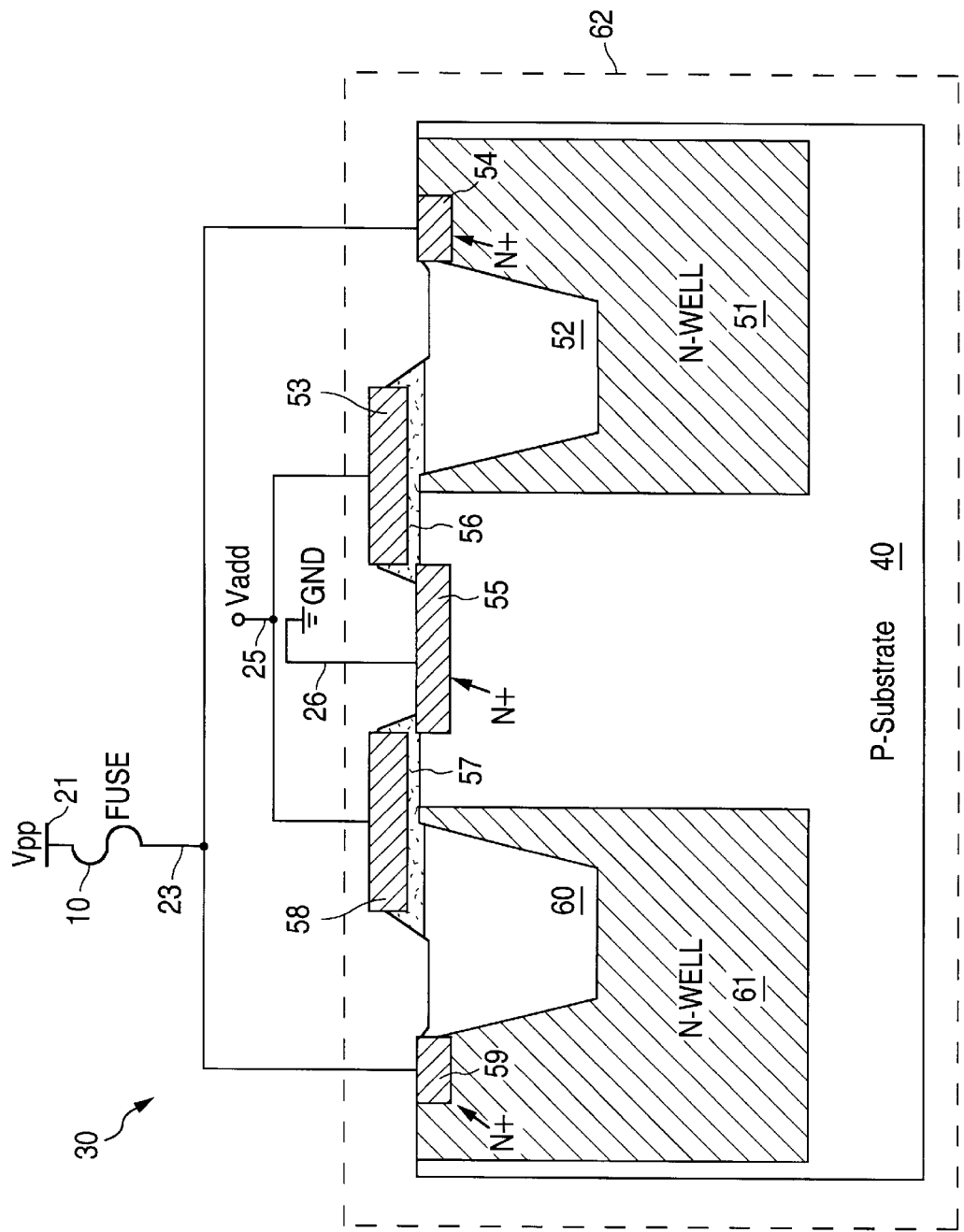

FIG. 6 shows a programming device 62 made up of two extended drain devices M28 connected in parallel. The left extended drain device includes N-well 61, trench 60, drain N+ region 59, gate 58, and gate oxide 57. The right extended drain device includes N-well 51, trench 52, drain N+ region 54, gate 53, and gate oxide 56. The N+ regions 54 and 59 form the drain of device 62, and are connected to one end of fuse 10 at lead 23. The N+ region 55 forms the source of device 62, and is connected to ground terminal GND. Gates 53 and 58 are connected to lead 25 which receives signal Vadd. With two extended drain devices connected in parallel, twice the current capability of device M28 of FIG. 4a is provided.

Figure 1:
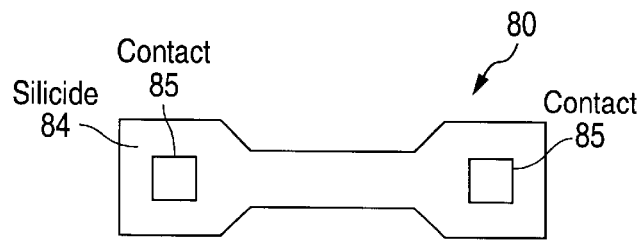
FIG. 1 shows a top view of a prior art fuse element.
Figure 7:
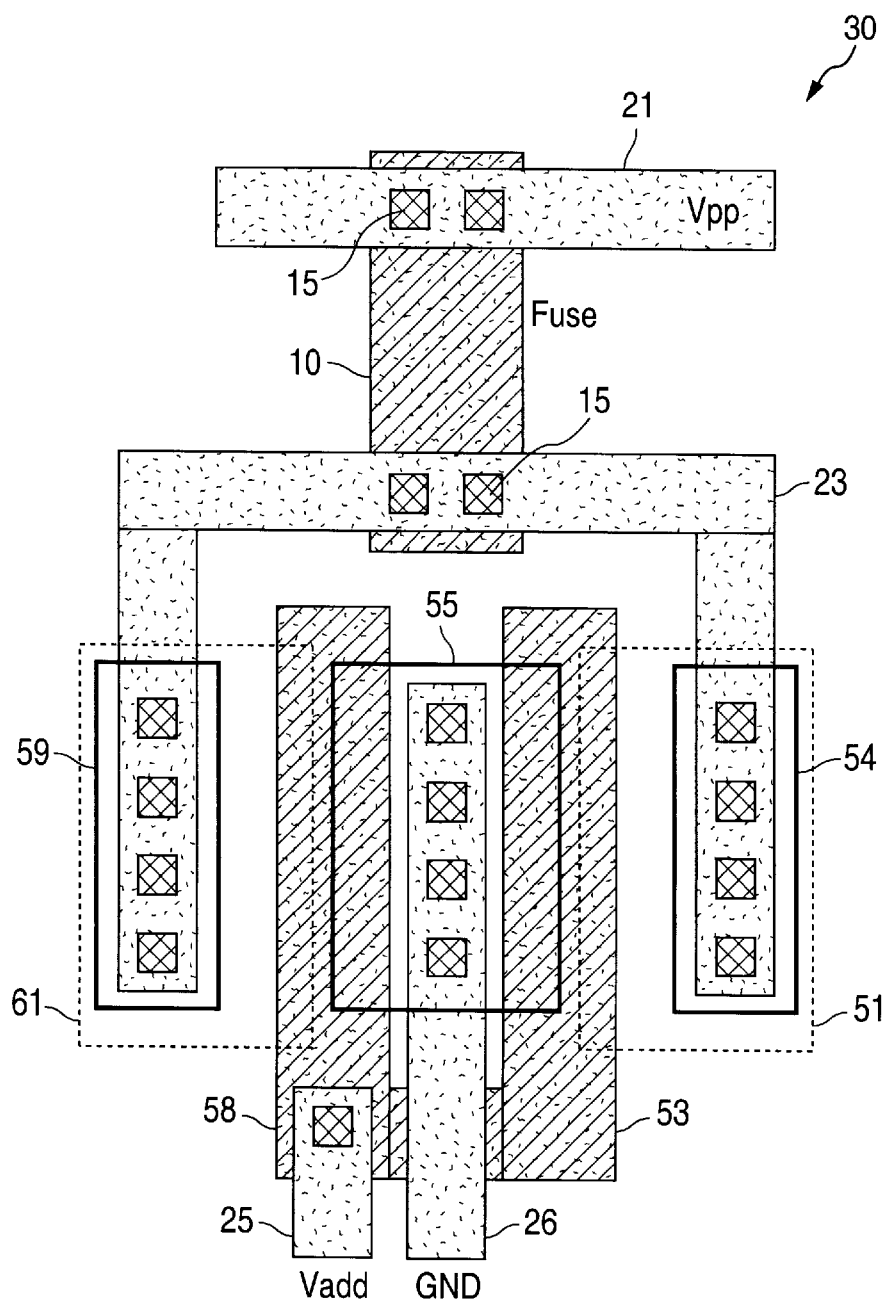
FIG. 7 shows a layout diagram corresponding to structure 30 of FIG. 6.

FIG. 7 shows a layout diagram corresponding to structure 30 of FIG. 6. The key for identifying each layer is shown at the bottom of FIG. 7. A rectangular shaped fuse 10 is connected between Vpp metal line 21 and a metal interconnect line 23 through contacts 15. The rectangular shape of fuse 10 is illustrative only. Fuse 10 may have any desired shape (e.g. a shape similar to fuse 80 of FIG. 1), but fuse 10 has a construction similar to that of FIG. 2a. Metal interconnect line 23 makes contact with each of N+ diffusion regions 54 and 59 through a set of contacts. N+ regions 54 and 59 form the drain of the programming device, and are formed in N-well regions 51 and 61, respectively. Polysilicon layers 53 and 58 are shown extending over a portion of the N-well regions 51 and 61, respectively. Source diffusion region 55 is formed between N-well regions 51 and 61, and has a portion of each of the polysilicon layers 53 and 58 extending over it. Source region 55 is connected to the ground metal line 26 through a set of contacts. Signal Vadd is provided on a metal line 25 which is connected to polysilicon 53 and 58. Trenches 52 and 60 are defined as the areas between the diffusion regions 55 and 59 and between diffusion regions 55 and 54.

Layout diagram of FIG. 7 is one of many different ways that structure 30 of FIG. 6 can be laid out. Also, the extended drain programming device of the present invention can be used for programming any fusible link, and is not limited to use with fuse 10 shown in FIG. 7.

Use of trench isolation in the extended drain device improves on the previously developed extended drain device with LOCOS (local oxidation of silicon) by allowing higher performance (i.e., higher current drive). The trench isolation process enables forming trenches which are much smaller than the oxide region formed by the LOCOS process. The smaller trench reduces the N-well parasitic resistance, which in turn increases the device drive capability.

Figure 8:
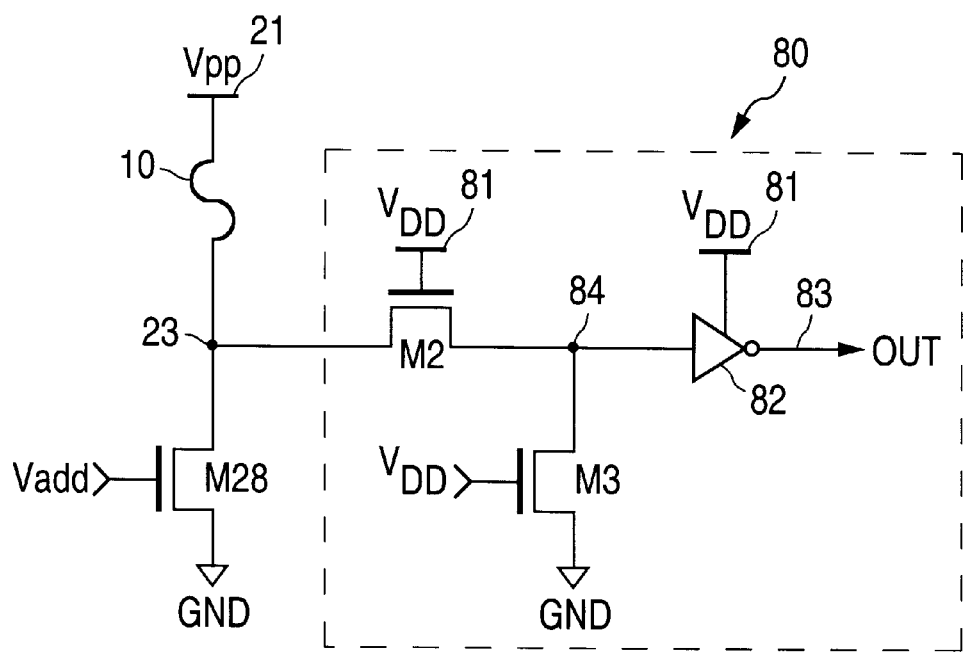
FIG. 8 shows a circuit diagram of one embodiment of a sensing circuit for sensing the state of fuse 10.

FIG. 8 is a circuit diagram of a sensing circuit 80 for determining whether fuse 10 is programmed. The NMOS transistor M28 corresponds to the programming device 28 of FIGS. 4 and 5a, but the parasitic resistor Rn is not shown. Fuse 10 is connected between Vpp and node 23, and M28 is connected between node 23 and GND. The gate of M28 receives the Vadd signal. Another extended drain NMOS transistor M2, having a cross section similar to that shown in FIG. 5a, has its drain connected to node 23, its source connected to node 84 and its gate connected to power supply $V_{DD}$. A NMOS transistor M3 is connected between node 84 and GND, and has its gate connected to $V_{DD}$. An inverter 82 connected between $V_{DD}$ and GND has its input terminal connected to node 84 and provides the signal OUT on its output terminal 83.

M2 is a pass transistor which prevents the full voltage (e.g., full Vpp if fuse 10 is not programmed) at node 23 from being transferred to node 84, and thus protects M3 and inverter 82 from exposure to high voltage. For example, if Vpp is 5V, and $V_{DD}$ is 2.5V, with 5V at node 23 (unprogrammed fuse 10), node 84 will only go as high as 1.5V (i.e., one Vt below $V_{DD}$) given that the threshold voltage of M2 is 1V. M2 also protects its own gate oxide from exposure to high voltage in the same manner as M28, described above.

M3 serves as a weak pull-down transistor for discharging node 84 to ground when fuse 10 is programmed (i.e., is burned). Inverter 82 is an inverting buffer designed to have a particular trip point so that if the voltage at node 84 goes below the trip point, OUT would go to $V_{DD}$, and if node 84 voltage goes above the trip point, OUT would go low. In the above example, with fuse 10 programmed, if the trip point of inverter 82 is set to 1.25V, M3 pulls node 84 voltage to below 1.25V, causing OUT go to $V_{DD}$. With fuse 10 unprogrammed, node 84 goes to 1.5V (one Vt below $V_{DD}$), which is above the 1.25V trip point, causing OUT to go low to the ground potential.

Note that because fuse 10 in its programmed state provides a finite amount of current (i.e., is not a complete open circuit), size of M3 must be carefully selected to ensure that M3 is capable of pulling node 84 below the trip point of inventor 82. Thus, depending on the targeted fuse 10 resistance, a particular device size may be selected for M3 which provides a leakage current sufficient to overcome the pull-up current of the programmed fuse 10, and pulls node 84 to below the trip point of inventor 82. For example, if fuse 10 is programmed to have a high resistance (e.g., as depicted by portion III of the FIG. 3 diagram), M3 can be designed to have a weak pull down current. Such low current helps prevent the unintentional programming of an unprogrammed fuse during sensing.

Inverter 82 may be a simple CMOS inverter wherein the PMOS and NMOS transistor sizes are ratioed to provide the desired trip point.

The sensing circuit 80 of FIG. 8 requires only four transistors, and thus consumes minimal silicon area compared to the sensing circuit of the Bohr et al. patent (supra). Such simple and small sensing circuit is possible only because fuse 10 is capable of being programmed to high resistance.

The sensing circuit 80 is one of many possible ways of sensing the state of fuse 10, and is provided only to illustrate how the high fuse resistance of the present invention minimizes the complexity of the sensing circuitry.

In one embodiment, the Vpp supply voltage is provided externally during wafer testing or package testing. In another embodiment, the Vpp supply is provided on chip using well known charge pump circuit techniques.

The above description of the present invention is intended to be illustrative and not limiting. The invention is not limited to any particular process technology. For example, the invention is applicable to CMOS, BiCMOS, NMOS, Bipolar, less than or greater than 0.25 µm lithography technologies. The extended drain transistor of the present invention may be either NMOS or PMOS. The invention includes all the variations and modifications falling within the scope of the appended claims.

What is claimed is:

1. A method of programming a fuse element having a stack of a low resistivity material over and in contact with a high resistivity material, the method comprising:

(A) applying a voltage across the stack to initiate current flow through the stack;

(B) increasing the voltage until a first discontinuity is formed in the low resistivity material; and (C) further increasing the voltage until the first discontinuity is increased in size.

2. The method of claim 1 wherein a resistance of the stack is increased after each of acts (B) and (C).

3. The method of claim 1 wherein the low resistivity material is from silicide, and the high resistivity material is from undoped polysilicon.

4. The method of claim 1 wherein the voltage at step (C) is increased in excess of approximately 3.5 volts.

5. The method of claim 1 wherein increasing the voltage at step (C) depletes the high resistivity layer.

6. The method of claim 1 wherein an extended drain transistor is used to switch the voltage applied at step (C).

7. The method of claim 6 wherein the extended drain transistor is an NMOS transistor.

8. The method of claim 6 wherein the extended drain transistor is implemented in a sub-0.25 µm CMOS technology.

9. A method of programming a fuse element comprising:

applying a first voltage across a low resistivity layer formed over a high resistivity layer until a discontinuity is formed in the low resistivity layer;

applying a second voltage across the high resistivity layer until the high resistivity layer is depleted and the discontinuity in the low resistivity layer is increased.

10. The method of claim 9, wherein the second voltage is in excess of 3.5 volts.

* * * * *